Sept. 11, 1951 A. HORVATH 2,567,208

CRYSTAL MIXER FOR MULTIPLEX BROADCASTING

Filed April 19, 1947

INVENTOR.
ALEXANDER HORVATH

BY Robert Harding Jr.
ATTORNEY

Patented Sept. 11, 1951 2,567,208

UNITED STATES PATENT OFFICE 2,567,208

CRYSTAL MIXER FOR MULTIPLEX BROADCASTING

Alexander Horvath, Clifton, N. J., assignor, by mesne assignments, to International Standard Electric Corporation, New York, N. Y., a corporation of Delaware Application April 19, 1947, Serial No. 742,679

1 Claim. (Cl. 250—20)

This invention relates to frequency mixer networks and more particularly to such networks as are used in ultra high-frequency or micro-wave systems.

A principal object of the invention is to provide an improved frequency converter for converting a very high frequency carrier into a corresponding intermediate frequency carrier.

Another object is to provide an improved frequency converter or mixer for use in superheterodyne systems employing a rectifying crystal as the mixer element.

Another object is to provide a frequency mixer system for use with wave transmission lines of the wave guide or coaxial line type operating at very high frequencies, and wherein the tuned circuits for the various sources and for the intermediate frequency part of the system are effectively separated from the crystal. This avoids the requirement of careful machining and extremely close tolerances in the matching transmission line section wherein the crystal is inserted.

A feature of the invention relates to a very high frequency mixer or converter employing a contact type crystal rectifier, wherein the radio frequency input is terminated in a load in the form of a crystal of the contact rectifier type which is shunted by a high impedance either of the lumped inductance type or of the resonant line type to enable the mixer to operate over a very wide band of frequencies, while at the same time effectively segregating the radio frequency energy from the intermediate frequency energy and from the local injection energy.

Another feature relates to an ultra high-frequency mixer or converter employing a contact crystal rectifier as the conversion element, the crystal being located in a coaxial line whose input end is supplied with the ultra high-frequency energy, and whose terminating end is short-circuited. In accordance with this feature, the local injection frequency is also injected into said line, and the desired intermediate frequency output is tapped off therefrom, so that the tuned intermediate frequency circuit is effectively separated from the tuning elements of the ultra high-frequency input and from the tuning elements of the local injection source.

A further feature relates to a simplified and very compact mixer unit for ultra high frequency work which can be readily connected to an intermediate amplifier, and wherein the ultra high-frequency input is effectively isolated from the input of the intermediate frequency amplifier without undue complexity of a construction and without requiring highly accurate machining of the cavity or box within which the crystal mixing action takes place.

A further feature relates to a simple and easily constructed radio frequency choke in the form of an inner tubular conductor and an outer tubular conductor forming a wave transmission line section with a common input opening for the ultra high-frequency energy and with separate openings for the local injection frequency and for a crystal mixer.

A still further feature relates to the novel arrangement and interconnection of parts which cooperate to provide an improved frequency mixer or conversion device particularly well suited for ultra high-frequency work.

Figure 1:
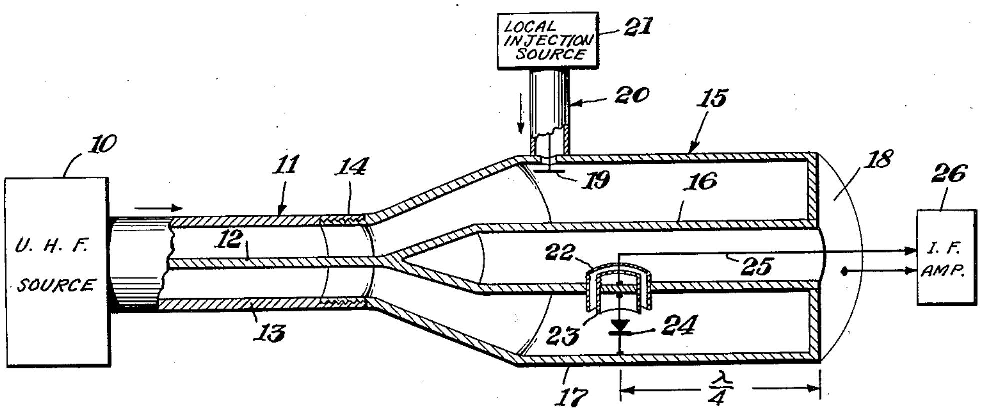
Fig. 1 is a diagrammatic circuit and structural view of one form of the invention.

The block 10 represents any suitable source of ultra high-frequency carrier which is to be converted into a corresponding lower intermediate frequency carrier capable of amplification by conventional intermediate frequency amplifiers. The source 10 is connected to the mixer by a high frequency wave transmission line 11 of the wave guide or coaxial line type, comprising for example the center conductor 12 and the outer tubular conductor 13. The line 11 is arranged to be coupled by any suitable threaded coupling 14 to the input end of a terminating load line 15, which, in accordance with the invention, consists of an inner tubular conductor 16 and a surrounding tubular conductor 17. This latter line is effectively short-circuited and preferably closed off by an annular conductive member 18. It will be observed that the center conductor 16 at the input end of the line 15 is tapered so as to enable the resistance of line 15 to be matched to the surge impedance of line 11 in the well-known manner. For example, the line 15 may be designed as a standard 50 ohm line.

Inserted through the wall of conductor 17 but D. C. insulated therefrom, is an injection electrode 19 which is connected via coaxial transmission line 20 to any suitable source 21 of local injection frequency for heterodyning with the ultra high frequency from source 10. Likewise, one of the walls of the inner conductor 16 has an opening through which passes a cylindrical conductor 22 which is in spaced relation to a smaller cylindrical conductor 23, so as to form therewith a D. C. blocking condenser. A high frequency crystal detector 24 has one electrode connected directly to the line conductor 17 and the other electrode connected to conductor 23. A conductor 25 is connected to the crystal and passes through the tubular conductor 16 to any suitable intermediate frequency amplifier 26 which of course incorporates a tuned circuit for selecting the particular intermediate frequency desired.

The crystal 24 may be of any well-known type such as commonly used in ultra high-frequency or micro-wave systems. In the well-known manner, when the energy from source 10 and the energy from source 21 are coupled into the line 15 as shown, the crystal 24 acts to produce a series of intermodulation products representing the sum and difference frequencies between these two sources, and of course the appropriate difference frequency is selected by the tuned circuits (not shown) forming part of the amplifier 26.

In accordance with another phase of the invention, the crystal 24 is located at a distance from member 18 equal to one-quarter of the wavelength of the frequency of the waves from source 10. Since this quarter-wavelength line is short-circuited at its remote end, it acts in the nature of a very high impedance across the crystal 24. Thus the ultra high-frequency energy is isolated from the intermediate frequency energy which is led out by conductor 25. As pointed out above, the line 15 may be a length of standard 50 ohm coaxial transmission line so that looking into the mixer from source 10, the latter sees an impedance of approximately 50 ohms. The impedance of crystal 24 is very nearly 50 ohms plus a small reactance depending upon the frequency of the source 10, which for example, may be 1000 megacycles and with a crystal current of between 1 and 2 milliamperes.

The foregoing described mixer system has a very broad frequency band characteristic, for example more than 80 megacycles and introduces a minimum of insertion loss, for example less than 5 decibels. Once the line 15 is properly designed and constructed, there is only only adjustment to make, namely the amplitude and frequency of the injection signal applied to electrode 19. Furthermore, with the construction as disclosed, the tuned circuits for the ultra-high frequency energy and for the local injection energy, and for the intermediate frequency amplifier are effectively separate from the crystal 24, thus eliminating the need for careful matching of line 15 within close tolerances.

Figure 2:
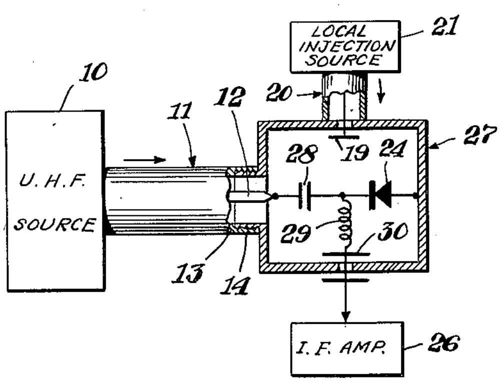
Fig. 2 is a schematic diagram of a preferred modification of Fig. 1.

Referring to Fig. 2, there is shown a modification of Fig. 1, wherein the same results are obtained but with a much smaller mixing unit and without requiring highly accurate machining of the cavity within which the crystal is connected. The parts shown in Fig. 2 which correspond functionally with those of Fig. 1, are designated by the same numerals. In this embodiment, the box or cavity 27 can be made of much smaller dimensions than the transmission line cavity 15 of Fig. 1, the only requisite being that the cavity 27 be of sufficiently small dimensions so that it resonates at a range entirely outside the frequency range of the source 10. For example, the box 27 may be in the form of a metal cylinder of approximately one inch length and one inch diameter or it may take the form of a metal box of approximately one inch on each side. In this embodiment, a D. C. blocking condenser 28 is connected between the center conductor 12 of the coaxial radio frequency input line and the crystal 24. Likewise, the crystal is connected to the intermediate frequency amplifier 26 through a series lumped inductance in the form of an ultra high-frequency choke coil 29, and one end of this choke coil is coupled to the box 27 for segregation of the utlra high-frequency energy by means of a condenser or capacity coupling 30. Since the inductance 29 is of very high impedance compared with the crystal 24, the mixer has a very high range of acceptance frequencies enabling it to operate over a very wide input band of ultra high-frequency energy. However, it is not necessary with this arrangement to accurately dimension the box 27 as is the case with Fig. 1, wherein the impedance line around the crystal 24 must be accurately dimensioned to form a quater-wavelength line.

The functioning of the system of Fig. 2 is substantially the same as that of Fig. 1, crystal 24 being subjected simultaneously to the action of the ultra high-frequency energy from source 10 and from the local injection oscillator source 21 to produce the required intermediate frequencies which are amplified by amplifier 26. However, because of the lumped inductance 29 and the capacity coupling 30, the ultra high-frequency energy is prevented from reaching the tuned input circuit of the amplifier 26 and likewise the local injection energy from source 21 is prevented from reaching the said input circuit of amplifier 26.

It will be understood that if image rejection is required, one or more tuned circuits may be added as appropriate filters between the source 10 and the crystal. These filters may be of any conventional design since they are not complicated by the mechanical requirements which would ordinarily be encountered were the crystal 24 connected directly in series or directly in shunt with the matching circuit.

Various changes and modifications may be made in the disclosed embodiment without departing from the spirit and scope of the invention.

What is claimed is:

A frequency mixer system comprising a source of ultra high frequency wave energy, a source of local injection frequency, an intermediate frequency selector circuit, a terminating load for said source of high frequency energy in the form of a coaxial transmission line having inner and outer tubular conductor, means to couple the energy from said source of ultra high frequency wave energy into said load line, means to couple the energy from said local injection source into said load line, a crystal mixer coupled across the inner and outer conductors of said line, a connection from said crystal to said intermediate frequency circuit, said connection passing interiorly through said inner tubular conductor, a coaxial transmission line connecting said load line to said source of ultra high frequency energy, said load line having the inner tubular conductor thereof tapered at its input end and connected to the center conductor of said last mentioned coaxial line, the opposite end of said line being short circuited, said load line being matched to the surge impedance of said coaxial connecting line.

ALEXANDER HORVATH.

REFERENCES CITED

The following references are of record in the file of this patent:

UNITED STATES PATENTS

| Number | Name | Date |
|---|---|---|
| 2,408,420 | Ginzton | Oct. 1, 1946 |
| 2,410,122 | Mercer | Oct. 29, 1946 |
| 2,433,387 | Mumford | Dec. 30, 1947 |
| 2,436,830 | Sharpless | Mar. 2, 1948 |
| 2,453,759 | Robinson | Nov. 16, 1948 |
| 2,455,657 | Cork et al. | Dec. 7, 1948 |
| 2,469,222 | Atwood et al. | May 3, 1949 |